United States Patent [19]

Pimpinella et al.

[11] Patent Number: 4,779,946
[45] Date of Patent: Oct. 25, 1988

[54] MICROMINIATURE OPTICAL ASSEMBLY

[75] Inventors: Richard J. Pimpinella, Phillipsburg; John M. Segelken, Morris Township, Morris County, both of N.J.

[73] Assignee: American Telephone and Telegraph Company, AT&T Bell Laboratories, Murray Hill, N.J.

[21] Appl. No.: 829,533

[22] Filed: Feb. 14, 1986

[51] Int. Cl.$^4$ .................. G02B 6/36; H01L 31/12; H01L 31/00
[52] U.S. Cl. .................. 350/96.20; 357/19; 437/225
[58] Field of Search .................. 29/572, 576 B, 580; 219/121 LJ; 250/227, 350/96.15; 96.20; 357/19, 30, 55

[56] References Cited

U.S. PATENT DOCUMENTS 4,127,862 11/1978 Ilegehs et al. .................. 357/30
4,217,598 8/1980 d'Aufia et al. .................. 357/19
4,326,771 4/1982 Henry et al. .................. 350/96.17
4,445,751 5/1984 Divens et al. .................. 350/96.14
4,570,173 2/1986 Anthony et al. .................. 357/20
4,577,209 3/1986 Forrest et al. .................. 357/30

Primary Examiner—William L. Sikes
Assistant Examiner—Akm E. Ullah
Attorney, Agent, or Firm—Eugene E. Pacher

[57] ABSTRACT

An assembly for coupling an optical fiber to a light emitter or detector comprises a silicon block having features that make possible easy alignment of the emitter or detector with the end of the optical fiber. The features comprise a through-aperture with sloping walls that receives and positions the end of the fiber in a predetermined location, and precisely defined conductive features that serve as alignment markers in the placement of the emitter or detector.

9 Claims, 5 Drawing Sheets

MICROMINIATURE OPTICAL ASSEMBLY

BACKGROUND OF THE INVENTION

This invention relates to coupling assemblies and, more particularly, to a microminiature coupling assembly designed to connect an optical fiber to an optical emitter or detector.

Lightwave communication systems including optical fibers are being utilized increasingly in a variety of applications of practical importance. To achieve integration of optical and electronic processing in such systems, some form of transducer is typically employed at each fiber end to effect a transformation between optical and electrical signal representations. Thus, at one end of each fiber in such a system, an electrical-to-optical signal transducer including a conventional light emitter is utilized to launch optical signals onto the fiber and, at the other end, an optical-to-electrical signal transducer comprising a standard photodetector is employed to convert optical signals to their electrical counterparts.

The desirability of providing inexpensive, compact and efficient assemblies for coupling a transducer to the end of a fiber has long been apparent. Moreover, it has been apparent that such assemblies should be structurally compatible with laterally extending planar-type systems that integrate optical and electronic elements in microminiature form. But heretofore no completely satisfactory coupling assembly having these and other desired attributes has been available. Accordingly, workers skilled in the art have devoted considerable efforts directed at trying to improve the design of such coupling assemblies. It was recognized that these efforts, if successful, had the potential for significantly improving the cost and performance of communication systems that include optical and electronic elements.

SUMMARY OF THE INVENTION

Hence, an object of the present invention is to improve coupling assemblies. More specifically, an object of this invention is to provide an improved coupling assembly adapted to connect an optical fiber to an optical emitter or detector.

Briefly, these and other objects of the present invention are realized in a specific illustrative embodiment thereof that comprises a silicon block diced from a wafer. Each block include lithographically defined features on opposed faces thereof. In a batch fabrication process, multiple sloped-wall through-apertures are formed by processing one face of the wafer to provide openings into which fiber ends are intended to be inserted in a self-aligned fashion. Metallization patterns are formed on the other face of the wafer in precise alignment with respect to these apertures. Mating metallization patterns are formed on the active sides of optical emitting or detecting devices. Soldering these device patterns to mating patterns on the face of each block results in accurate alignment of the devices relative to their respective apertures.

Thus, when a fiber is inserted into one of the apertures, the end of the fiber is accurately aligned with respect to its associated emitter or detector. By cementing the aligned fiber end in place in the assembly, a rugged and efficient coupling structure is achieved in a simple and inexpensive manner.

The silicon block diced from the wafer may include only a single aperture. In that case, the coupling assembly comprising the block is designed to accommodate only one fiber and a single emitter or detector. Alternatively, the block may include multiple apertures designed to receive multiple fibers and to mount multiple emitters/detectors in respective alignment therewith.

BRIEF DESCRIPTION OF THE DRAWING

A complete understanding of the present invention and of the above and other features thereof may be gained from a consideration of the following detailed description presented hereinbelow in connection with the accompanying drawing, not drawn to scale, in which.

DETAILED DESCRIPTION

For purposes of a specific illustrative example, emphasis herein will be directed to particular coupling assemblies made of silicon. Silicon assemblies exhibit advantageous thermal-conductivity properties and, significantly, may be fabricated utilizing standard processing techniques well known in the semiconductor art.

In accordance with the principles of the present invention, it is advantageous to process a conventional silicon wafer in a series of batch fabrication steps to obtain multiple apertured blocks suitable for making applicants' inventive assemblies. An illustrative such wafer 10 is shown in FIG. 1.

Figure 1:
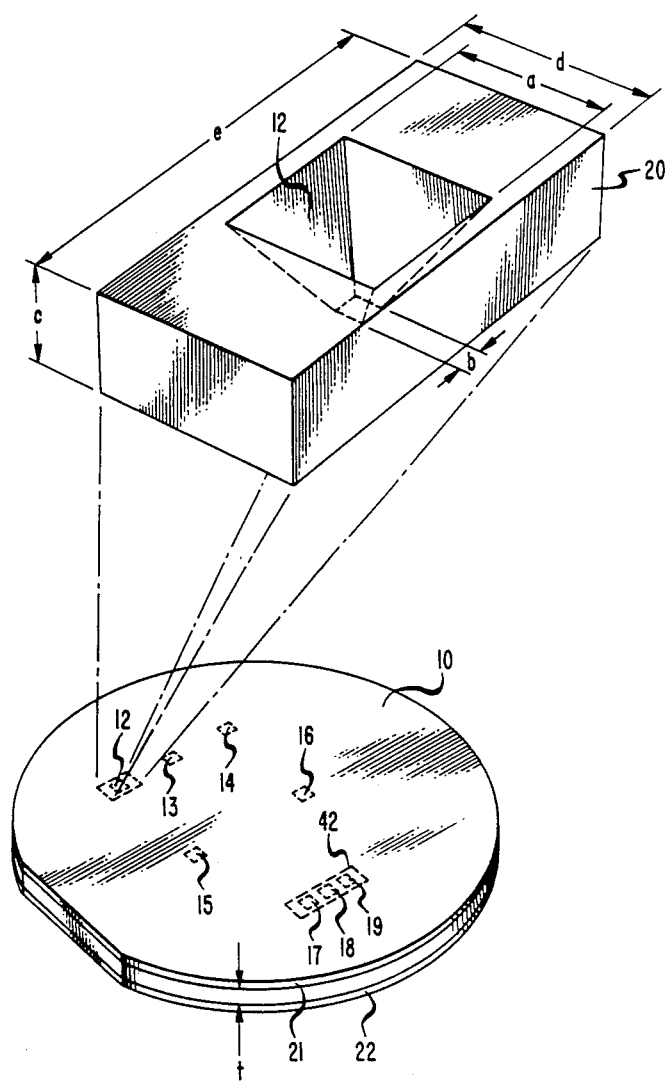
FIG. 1 is a schematic representation showing a single-aperture block diced from a wafer in accordance with the principles of the present invention.

Advantageously, the wafer 10 of FIG. 1 is made of monocrystalline silicon and is cut and polished in the form of a disc about 75 to 150 millimeters (mm) in diameter, with a thickness t of approximately 0.55 mm. In accordance with a feature of this invention, the top and bottom surface of the wafer 10 are parallel and lie in (100) crystalline planes of the silicon structure. The reason for selecting this particular orientation will be evident later below when a preferential etching step included in the fabrication sequence for the assembly is described.

In accordance with applicants' herein-described fabrication sequence, multiple spaced-apart through-apertures are formed in the wafer 10 shown in FIG. 1. For aperture and block dimensions of the type specified later below, thousands of such apertures are typically simultaneously formed in the wafer 10. Only eight of these apertures, numbered 12 through 19, are explicitly shown in FIG. 1.

Illustratively, an etch-resistant layer made, for example, of silicon dioxide about two micrometers thick is initially formed on the top and bottom surfaces of the wafer 10 (FIG. 1). These top and bottom layers of silicon dioxide, respectively designated 21 and 22, are shown in FIG. 1. Then a layer of a conventional resist material is applied to the entire top surface of the wafer. By standard lithographic techniques, the resist layer is then patterned to define multiple spaced-apart features therein. Illustratively, these features constitute squares whose dimensions will be specified later below.

Subsequently, the patterned resist layer is utilized as a mask for correspondingly patterning the underlying oxide layer on the wafer 10. This is done, for example, by removing the exposed portions of the oxide layer on the top surface of the wafer in a conventional plasma-assisted etching process.

Next, the resist pattern is removed in a standard way and then, utilizing the patterned oxide layer as a mask, exposed portions of the underlying silicon wafer itself are etched to form through-apertures. Advantageously, the through-apertures are formed in a wet etching step in which the wafer 10 is inherently preferentially etched to reveal (111) planes that constitute sloped walls of the through-apertures. Specifically, each wall so formed is inclined at an angle $\theta$ (see FIG. 3) of 54.74 degrees with respect to the top surface of the wafer.

One available etchant for forming the aforedescribed through-apertures in the wafer 10 comprises potassium hydroxide dissolved in deionized water and propanol. Etching with such a solution is effective to form multiple identical through-apertures in the wafer 10 of FIG. 1.

Other etchants are available for forming the aforedescribed sloped-wall through-apertures in the silicon wafer 10. Thus, for example, ethylenediamine (EDA) may also be utilized to form the apertures. With EDA, however, etching of through-apertures in the wafer occurs at a slower rate. Also, with EDA, a 2000 Angstrom-unit (Å)-thick layer of silicon dioxide is sufficient to serve as an effective etch-resistant mask during the aperture-forming step.

Any bottom-surface silicon dioxide that remains in place at the bottoms of the sloped-wall apertures is removed in, for example, a standard plasma-assisted step.

Figure 2:
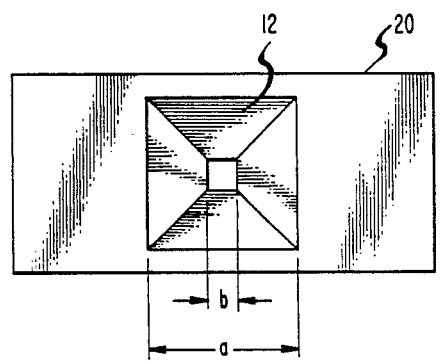
FIGS. 2 and 3 are top and side views, respectively, of the FIG. 1 block.
Figure 3:
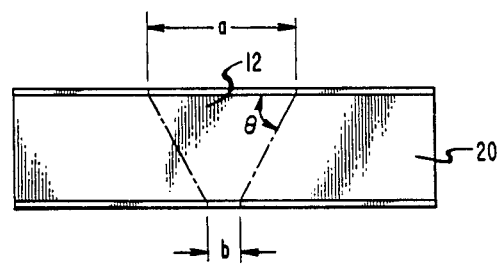

The exact nature of one of the identical apertures formed in the wafer 10 is indicated in FIG. 1 which includes an enlarged version of the through-aperture 12. (The block 20 that contains the enlarged aperture 12 is actually diced from the wafer 10 in a later step in the herein-described fabrication sequence, as will be specified later below.) Top and side views of the aperture 12 are also shown in FIGS. 2 and 3, respectively.

By lithographically controlling the dimensions of the relatively large square openings etched in the top surface of the wafer 10 of FIG. 1, it is thereby possible in effect to specify the dimensions of the relatively small square openings defined in the bottom surface of the wafer. Thus, for example, if the dimension a of the larger square indicated in each of FIGS. 1 through 3 is controlled to be 0.9 mm, it is apparent from simple geometrical considerations that the dimension b of the smaller square will be 0.125 mm.

By thus controlling the dimensions of the sloped-wall through-apertures etched in the wafer 10 of FIG. 1, it is possible to correspondingly control the distance that fiber ends of a given diameter can extend into the apertures before contacting the surfaces of the sloped walls. Of course, if the apertures are made large enough relative to the fiber diameter, the fiber ends can extend all the way through their respective apertures. But in many cases it is advantageous to maintain each fiber end a prescribed distance short of the bottom surface of the block in which the through-aperture is formed. In that way, a precisely specified gap can be established between the fiber end and the active region of an associated emitter or detector mounted on the bottom surface of the block, as will be evident from the further description later below.

Next, the oxide-coated bottom side of the wafer 10 shown in FIG. 1 is processed to form a prescribed metallization pattern thereon. Illustratively, a structure of titanium, nickel and gold are deposited in that order on the bottom-side oxide layer. By standard lithographic techniques, the three-layer metallization is then patterned to form prescribed features. By utilizing the openings in the bottom surface of the wafer as alignment marks, the metallization pattern so formed is precisely positioned with respect to the through-apertures in the wafer.

By way of example, patterning of the three-layer metallization involves first applying a resist layer thereon. The resist layer is then patterned in conventional ways, and substantially utilized as an etch-resistant mask for patterning the gold layer. The gold, nickel and titanium layers are etched employing, for example, standard plasma-assisted etching techniques.

Subsequently, any remaining resist material is removed from the bottom side of the wafer 10 (FIG. 1). By standard techniques, the individual features of the entire three-layer metallization pattern are then coated with a layer of solder or other suitable conductive material.

Figure 4:
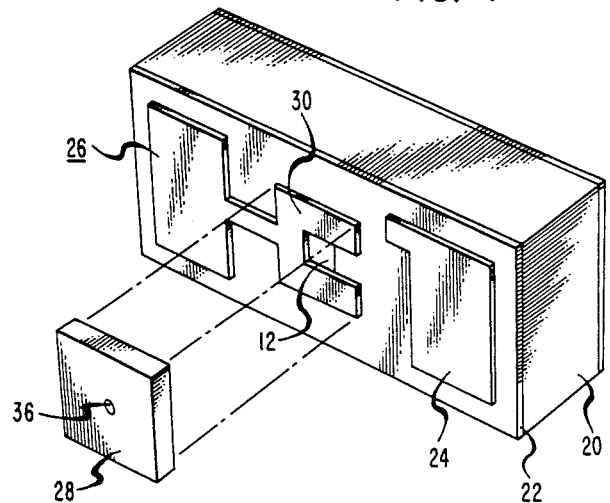
FIG. 4 depicts the metallization pattern formed on the bottom of the FIG. 1 block and shows an emitter or detector device designed to be mounted thereon.

One pair of features of the repetitive metallization pattern that is thereby formed on the entire bottom side of the wafer 10 of FIG. 1 is shown in FIG. 4. (FIG. 4 actually shows the bottom side of one block 20 that is subsequently diced from the wafer 10.)

The features formed on the bottom-side oxide layer 22 of the block 20 depicted in FIG. 4 include spaced-apart metallic elements 24 and 26. These elements are designed to be electrically connected to the respective terminals of an optical emitting or detecting device. Such a device 28 is also depicted in FIG. 4.

The elements 24 and 26 shown in FIG. 4 can be configured in a variety of different ways. The particular configurations represented in FIG. 4 are illustrative only.

The wafer 10 shown in FIG. 1 may, for example, be diced into individual blocks after the aforementioned elements have been formed on the bottom surface of the wafer. The previously mentioned block 20 is representative of multiple identical single-aperture blocks obtained from the wafer. Of course, other blocks each containing two or more through-apertures may also be separated therefrom. By means of such multiple-aperture blocks, plural fibers can be coupled to plural respective emitters or detectors in a single unitary assembly. By way of example, dash line 42 in FIG. 1 indicates a portion of the wafer 10 that will be later separated therefrom to form a three-aperture assembly.

In one specific illustrative embodiment of applicants' invention, the dimensions a and b of the block 20 shown in FIG. 1 are approximately 0.9 and 0.125 mm, respectively, as previously mentioned. In that same embodiment, the dimensions c, d and e shown in FIG. 1 are, for example, about 0.55, 1.0 and 1.5 mm, respectively.

The right-hand C-shaped portion 30 of the solder-coated element 26 shown in FIG. 4 is precisely positioned with respect to the bottom opening of the through-aperture 12 formed in the block 20. When the device 28 is mounted in place to contact the C-shaped portion 30, the active region of the device 28 is designed to be accurately centered relative to the bottom-side opening of the through-aperture 12.

Figure 5:
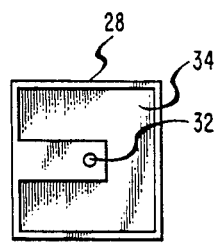
FIG. 5 is an illustrative representation of the active side of one type of device adapted to be mounted on the bottom of the FIG. 1 block.

By way of a specific illustrative example, FIG. 5 shows the right-hand or active face of a particular device of the general type represented in FIG. 4 and designated by reference numeral 28. The particular device represented in FIG. 5 is a light-emitting diode having an active or emitting region 32 that is approximately 0.55 mm in diameter.

One electrical terminal of the diode 28 of FIG. 5 constitutes a metallic solder-coated portion 34 formed on the front or active face thereof. The other electrical terminal of the diode comprises, for example, a metallic portion 36 formed on the back face thereof, as indicated in FIG. 4.

In accordance with a feature of the principles of the present invention, the metallic portion 34 shown in FIG. 5 is designed to be substantially identical to the C-shaped portion 30 represented in FIG. 4. To attach the device 28 to the block 20, the portion 34 of the device 28 is brought into contact and approximate registration with the mating portion 30 on the block 20. Then, in a standard reflow soldering step, the device 28 is mechanically and electrically affixed to the block 20. During this step, surface tension forces act to bring the portions 30 and 34 into substantially exact alignment with each other. As a result, the active region 32 of the affixed device 28 is approximately exactly centered with respect to the bottom-side opening of the through-aperture 12.

Figure 6:
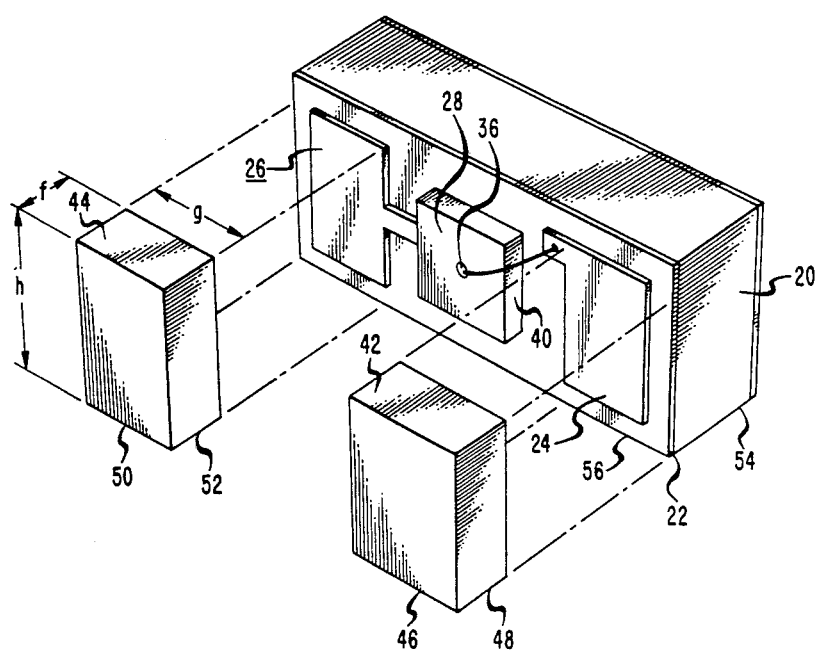
FIG. 6 shows an emitter or detector device mounted in place on the bottom of the FIG. 1 block and further depicts two conductive members also designed to be mounted thereon.

The aforedescribed attachment of the device 28 to the block 20 results in one terminal of the device being electrically connected to the portion 26. The other terminal of the device is then electrically connected to a tab region of the portion 24. As represented in FIG. 6, this is done, for example, by means of a conventional wire bond 40 that connects the portion 36 on the back of the device 28 to the noted tab region.

In many practical applications, it is important that a coupling assembly of the type described herein be compatible with and easily mounted in a laterally extending integrated architecture that includes optical and electronic components. For that purpose, it is advantageous to add contact blocks to the aforedescribed assembly. Two such contact blocks 42 and 44 are shown in FIG. 6.

The contact blocks 42 and 44 comprise, for example, nickel-palted metallic elements. Illustratively, the faces of the contact blocks 42 and 44 that are intended to be attached to the bottom surface of the block 20 (see FIG. 6) are coated with solder. By such attachment, the blocks 42 and 44 are established in respsective electrical contact with the elements 24 and 26. Advantageously, the attachment is done in a manner to ensure that the edges 46, 48 of the contact block 42, the edges 50, 52 of the contact block 44 and the edges 54, 56 of the apertured block 20 all lie in the same plane. The faces of the contact blocks 42 and 44 that lie in that plane constitute planar contact pads that can easily be mounted on mating contact pads on an associated planar electronic assembly.

In one specific illustrative embodiment of applicants' invention, the dimensions f and g of each of the substantially identical blocks 42 and 44 (FIG. 6) are approximately 0.45 mm and 0.45 mm, respectively. In that same embodiment, the dimension h is about 1.0 mm.

It is generally advantageous to test the overall assembly represented in FIG. 6 before permanently inserting a fiber end therein. This is easily done by mounting the contact blocks 42 and 44 in a standard test fixture (not shown). In that way, power can be conveniently applied to the device 28 for a prescribed test period. Failure-prone devices and connections in the overall assembly can be thereby detected before installing the assembly in an actual system.

Figure 7:
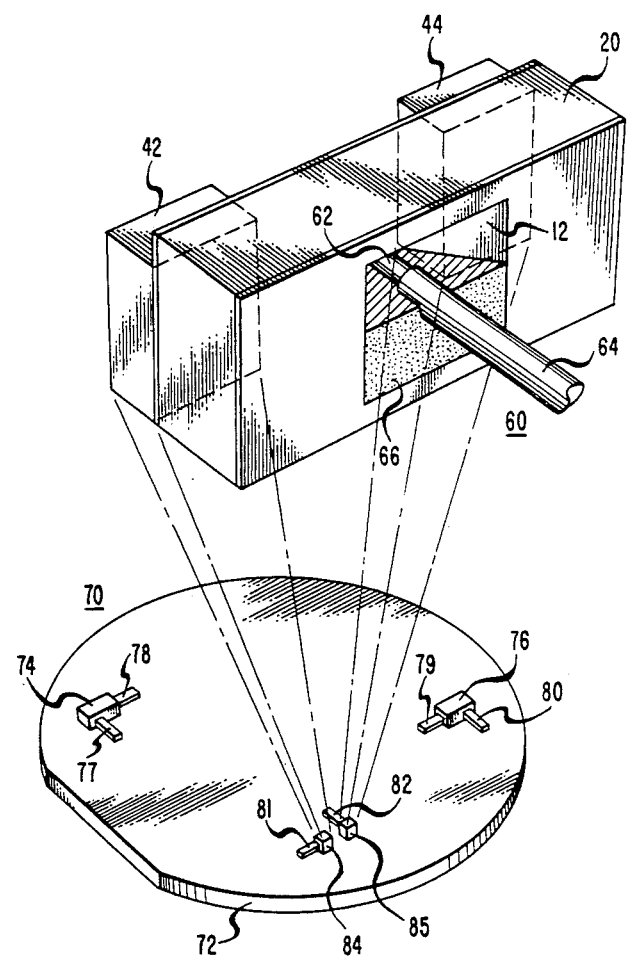
FIG. 7 represents a specific illustrative assembly made in accordance with the principles of the present invention included in a wafer-scale-integrated structure.

FIG. 7 shows an optical fiber 60 inserted into the aperture 12 of the aforementioned block 20. Illustratively, the fiber includes a glass body 62 covered with an acrylic sheath 64. By way of example, a portion of the sheath on the fiber end to be inserted within the aperture 12 is removed before insertion therein. Advantageously, the dimensions of the body 62 relative to the dimensions of the sloped-wall aperture 12 are selected such that the left-hand face of the body 62 falls short of the bottom of the aperture 12 by a prescribed amount. In that way, as described earlier, a prescribed gap is established between the end of the fiber and the active region of the device mounted on the block 20. Possibly deleterious rubbing contact between the fiber end and the active region is thereby avoided during assembly and during any thermal cycling that occurs in actual operation.

Sloped-wall apertures of the type described herein are paticularly advantageous in that they ensure easy self-alignment of fibers inserted therein. After being inserted, the aligned fibers are secured in place by means, for example, of a standard epoxy cement. Such a cement 66 is shown in FIG. 7 in a partially broken-away manner, thereby to allow a better view of the interior of the depicted assembly. In practice, the entire volume of the aperture 12 surrounding the fiber 60 is typically filled with cement.

FIG. 7 also is intended to show by way of illustration that the aforespecified coupling assembly is well suited to be associated with, for example, a wafer-scale-integrated (WSI) structure 70. The depicted WSI structure comprises, for example, a wafer 72 having multiple very-large-scale-integrated (VLSI) devices mounted thereon by standard face-down solder-ball bonding techniques. Only two of multiple such devices are explicitly shown in FIG. 7. These devices are designated by reference numerals 74 and 76. Also, microminiature interconnects formed on the wafer 72 are symbolically represented in FIG. 7 by elements 77 through 82. Two of these interconnects, 81 and 82, are shown connected to contact pads 84 and 85 located on the periphery of the wafer.

As shown in FIG. 7, the bottoms of the contact blocks 42 and 44 of applicants' inventive coupling assembly are designed to respectively engage and make electrical and thermal contact with the aforementioned pads 84 and 85. In that way, optical signals can conveniently be transmitted to or from the depicted WSI structure. Of course, plural such single-aperture coupling assemblies (or multiple-aperture assemblies) can be mounted on the wafer 72 to provide any specified number of optical/electronic connections between the WSI structure 70 and associated components (not shown) of an overall system.

Illustratively, the bottoms of the contact blocks 42 and 44 (FIG. 7) and the surfaces of the pads 84 and 85 to be respectively attached thereto are first each coated with a layer of solder. Attachment and alignment therebetween is then carried out in, for example, a standard reflow-solder step.

Finally, it is to be understood that the above-described structures and processing techniques are only illustrative of the principles of the present invention. In accordance with these principles, numerous modifications and alternatives may be devised by those skilled in the art without departing from the spirit and scope of the invention. Thus, for example, although primary emphasis herein has been directed to coupling assemblies made of silicon, it is apparent that blocks made of other materials may also be lithographically patterned in the unique way described herein to form microminiature coupling assemblies. Also, other ways of achieving alignment between optical emitting or detecting devices and respective associated apertures in a block of the type described herein are feasible. Thus, for example, lithographically defined raised portions and mating depressed or grooved portions may be formed on the active sides of the devices and on the associated block faces to achieve the desired alignment.

What is claimed is:

1. An assembly comprising
    a block having first and second opposed parallel faces;
    at least one through-aperture formed in said block extending between said first and second faces and having a main longitudinal axis perpendicular to said first and second faces, the opening provided by the at least one aperture in the first face being adapted to have the end portion of an optical fiber inserted therein, the aperture having sloping side walls adapted for centering the end portion of the optical fiber with respect to the opening provided by the aperture in the second face; and
    conductive features on the second face in precise alignment with the opening provided by the aperture in said second face such that, when an optical emitting or detecting device having an active region is mounted on said second face to make electrical connections with the respective conductive features, the active region of the device is centered relative to the aperture in the second face, whereby the device is in optical coupling relationship with the optical fiber.

2. An assembly as in claim 1 further including
    conductive contact members electrically connected to the respective features associated with a mounted device.

3. An assembly as in claim 2 further including
    a planar wafer-scale-integrated structure having bonding pads thereon, the contact members being respectively mounted on and electrically connected to said pads.

4. An assembly according to claim 2 further comprising an optical device mounted on the second face of said block and electrically connected to its respective conductive features in aligned relationship with its associated aperture;
    an optical fiber having an end portion positioned in the aperture in optical coupling relationship with the optical device and secured in the aperture; and
    a planar wafer-scale-integrated structure having bonding pads thereon, the contact members being respectively mounted on and electrically connected to said bonding pads.

5. An assembly as in claim 1 wherein said block comprises monocrystalline silicon.

6. An assembly as in claim 5 wherein the faces of said block lie in (100) crystalline planes.

7. An assembly as in claim 7 wherein each sloped aperture wall lies in a (111) crystalline plane of said block.

8. An assembly as in claim 1 further including
    an optical device mounted on the second face of said block and electrically connected to its respective conductive features in aligned relationship with its associated aperture.

9. An assembly as in claim 8 further including
    an optical fiber having an end portion positioned in the at least one aperture of said block in optical coupling relationship with the optical device, and means securing the fiber end portion in place in the aperture.

* * * * *